Dec. 18, 1956 C. P. CARDANI ET AL 2,774,949

INVERTIBLE SOCKET OR RECEPTACLES

Filed May 20, 1955 3 Sheets-Sheet 1

Inventors
Charles P. Cardani
Joseph Harrington, Jr.
By their Attorney

Dec. 18, 1956 C. P. CARDANI ET AL 2,774,949

INVERTIBLE SOCKET OR RECEPTACLES

Filed May 20, 1955 3 Sheets-Sheet 2

Inventors
Charles P. Cardani
Joseph Harrington, Jr.
By their Attorney

Dec. 18, 1956 C. P. CARDANI ET AL 2,774,949

INVERTIBLE SOCKET OR RECEPTACLES

Filed May 20, 1955 3 Sheets-Sheet 3

Inventors
Charles P. Cardani
Joseph Harrington, Jr.
By their Attorney

United States Patent Office 2,774,949

Patented Dec. 18, 1956

2,774,949

INVERTIBLE SOCKETS OR RECEPTACLES

Charles P. Cardani, South Hamilton, and Joseph Harrington, Jr., Wenham, Mass., assignors to United Shoe Machinery Corporation, Flemington, N. J., a corporation of New Jersey Application May 20, 1955, Serial No. 509,772

4 Claims. (Cl. 339—128)

This invention relates to mounting means for electronic tubes and the like and more particularly to improved invertible sockets in which the base pins of tubes or other electrical components may be removably secured in electrically connected relation to circuitry, for example printed wiring on panels or wiring boards. Although the invention is herein specifically illustrated as embodied in tube sockets intended for use on a chassis of the printed circuit type, the invention is not thus limited to particular construction and may have application to various types of chassis whether in the form of insulating supports or otherwise; moreover, this invention may well have use as a receptacle for the mounting of electronic or electrical components having spaced prong or pin type mounting elements.

The electronics industry is increasingly using printed wiring boards as the chassis on which to assemble various forms of components. Automatic assembly and inspection of electronic equipment is also being given more and more attention as it is recognized that strides in standardization of components, for example tube sockets, can be achieved with attendant benefits to the industry. In general, components are applied to one side of a panel or wiring board, their leads extending through preformed holes in the board to effect electrical contact with the printed circuit on the other side of the board, thus advantageously enabling subsequent dip soldering treatment of the numerous junctions simultaneously. For convenience, it may be said that a panel accordingly has a copper (i. e., circuit) side and an opposite or component side. Many hundreds of different tube socket designs currently are available to assemblers of electronics equipment, distinguishing features in many instances being of relatively small significances. Rather recently assemblers have found good reason to insert special tube sockets from the copper side of a plate. So far as known, all of the existing tube sockets, including the special ones just referred to, are so constructed that they cannot receive tube prongs or base pins except from that side of a board or chassis on which the sockets are inserted.

In view of the foregoing, and since in general it is preferable to place sockets from above, it is a primary object of this invention to provide an improved socket which may be inserted in a wiring board, top or bottom side up, to receive the base pins of a tube or other component from either the copper or the component side of the board.

Pursuant to the object just stated and in accordance with a novel feature of the invention, a socket for mounting in a support comprises, in one aspect, a generally cylindrical nonconductive body having a plurality of circularly arranged pin-receiving holes extending from one end face to its other end face, said body having a plurality of peripherally spaced lands and contact-receiving grooves extending between said end faces, certain of said lands uniformly projecting radially from the body throughout their length to register the body in predetermined relation with the support therefor, and other of said lands having portions adjacent to said end faces projecting radially less than intermediate portions thereof, the intermediate portions of said other lands respectively being formed to provide oppositely disposed stop surfaces, and a plurality of contacts respectively having pin-engaging ends in said holes and opposite end portions extending in said contact receiving grooves, said opposite end portions being formed with resilient latching surfaces respectively spaced from the adjacent stop surfaces by substantially the thickness of said support.

In another aspect a further feature of the invention resides in the provision of an invertible socket for mounting tubes or other pin-bearing components in electrically connected relation to a printed circuit, said socket being insertable, either bottom or top side up, into a printed wiring board from either side thereof and comprising a generally cylindrical nonconductive body having a plurality of circularly arranged pin-receiving holes extending from one end face to its other end face, said body having peripherally spaced lands and contact-receiving grooves extending between said end faces, certain of said lands uniformly projecting radially from the body throughout their length to register the body in predetermined relation with the wiring board and other of said lands respectively projecting radially to a different extent adjacent to one end face than adjacent to the other end face to provide stop surfaces, alternate stop surfaces being engageable with said one side of the wiring board.

The above and other features of the invention together with novel details of construction and combination of parts will now be more particularly described in connection with two illustrative sockets in which the invention is embodied and with reference to the accompanying drawings thereof, in which.

Figure 6:
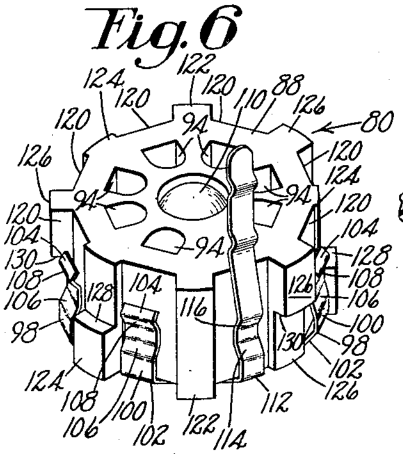
Fig. 6 is a perspective view of another and different socket illustrative of the invention and which is insertable into a hole in a chassis from either side thereof, and either top or bottom side up.
Figure 7:
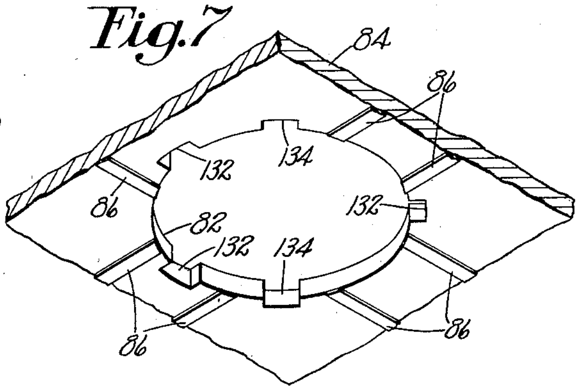
Fig. 7 is a perspective view (corresponding with Fig. 2 above) of a portion of a wiring board bearing a printed circuit and indicating slots adapted to receive and predeterminably register the socket shown in Fig. 6.
Figure 8:
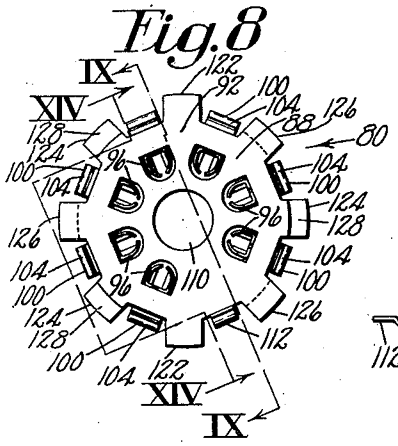
Fig. 8 is a plan view of the socket shown in Fig. 6.
Figure 9:
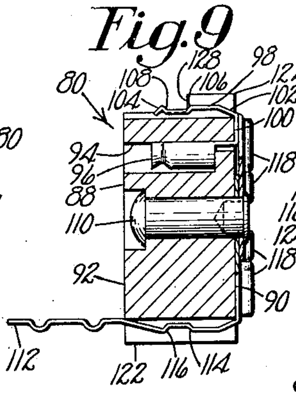
Fig. 9 is a section taken on the line IX—IX of Fig. 8.
Figure 10:
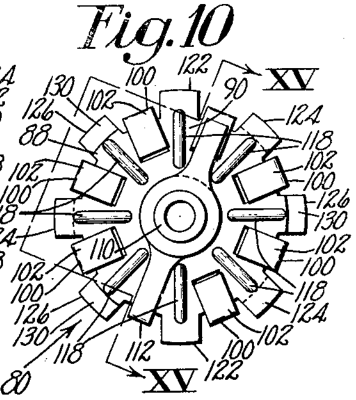
Fig. 10 is a bottom view of the socket shown in Fig. 6.
Figures 11, 12, 13, 14, 15:
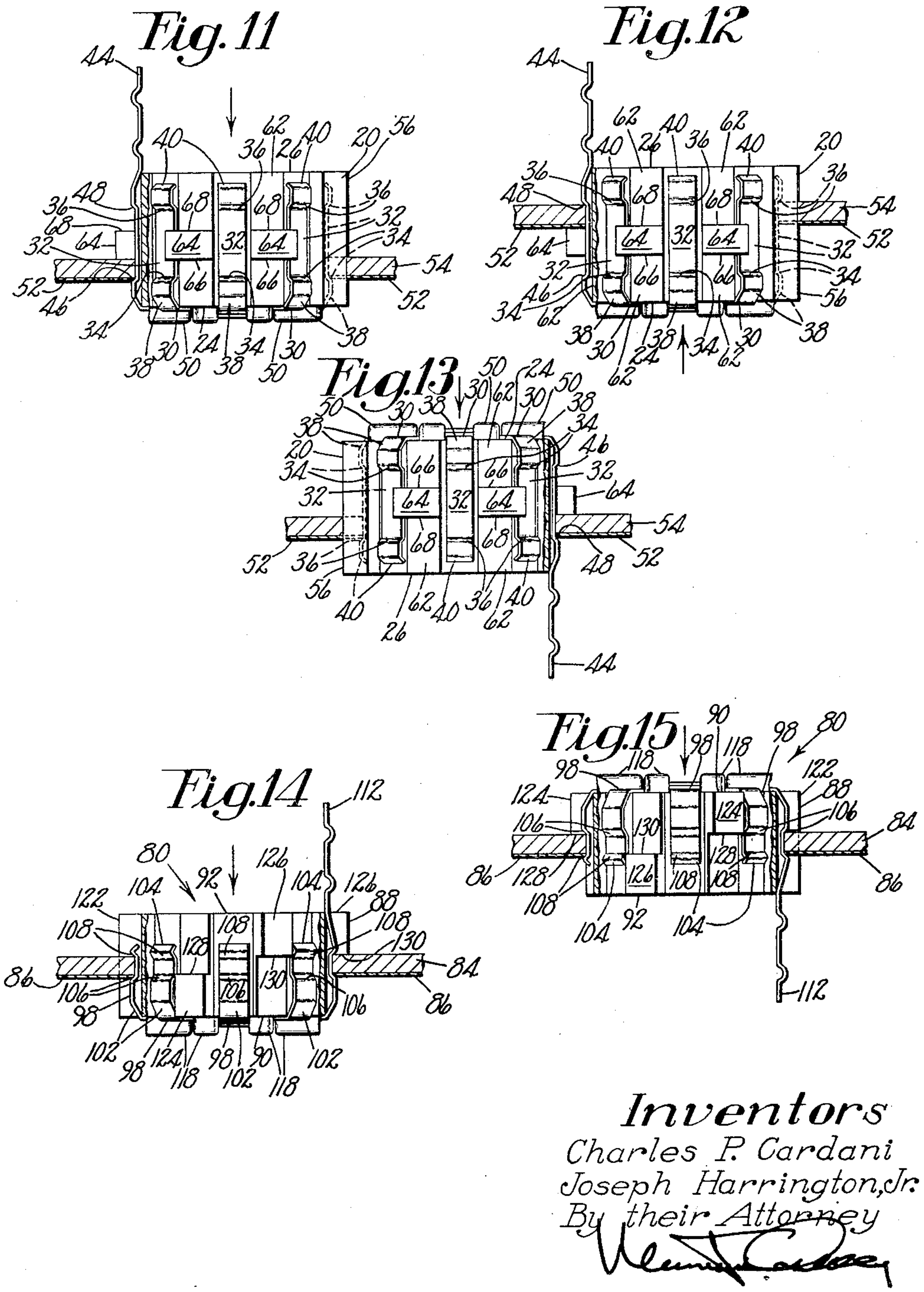
Fig. 11 is a partial section taken on the broken line XI—XI of Fig. 3 and indicating the socket shown in Fig. 1 when mounted, top up and from above, in the wiring board shown in Fig. 2.
Fig. 12 is a partial section taken on the broken line XI—XI of Fig. 3 and showing the socket of Fig. 1 inserted in the wiring board of Fig. 2 from below and top up.
Fig. 13 is a partial section taken on the broken line XIII—XIII of Fig. 5 and showing the socket of Fig. 1 inverted and inserted in the wiring board of Fig. 2 from above.
Fig. 14 is a partial section taken on the broken line XIV—XIV of Fig. 8 and showing the socket of Fig. 6 inserted from above with its top up in the wiring board of Fig. 7.

Fig. 15 is a partial section taken on the broken line XV—XV of Fig. 10 and showing the socket of Fig. 6 inserted from above with its bottom up in the wiring board of Fig. 7.

Figure 1:
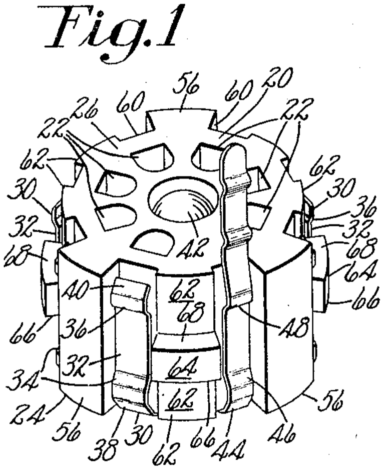
Fig. 1 is a perspective view of a socket in which the invention is embodied and which is insertable into a hole in a chassis from above or below, and either top or bottom side up.
Figure 2:
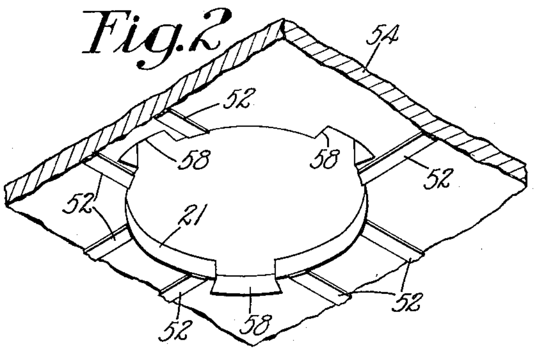
Fig. 2 is a perspective view of a portion of a socket support in the form of a wiring board bearing a printed circuit and having slots adapted to receive and predeterminably register the socket shown in Fig. 1.

The socket illustrated in Figs. 1, 3, 4, 5, 11, 12 and 13 comprises a generally cylindrical body 20 of nonconducting material, preferably a molded plastic, intended for insertion in a circular hole 21 (Fig. 2). The body is provided with a plurality of concentrically arranged holes 22 extending between its bottom end face 24 and its top end face 26, these holes being adapted respectively to receive pin engaging ends 28 (Figs. 3 and 4) of metallic contacts 30. Each of the latter has a resilient flat tab portion 32 that is bent in U-shape fashion to extend radially beneath the bottom end face 24 and axially along the periphery of the body 20. For a purpose hereinafter explained, each tab portion 32 is further bent to provide spaced latching shoulders 34, 36 and inclined cam surfaces 38, 40. The contacts 30 are arranged with the shoulders 34, 36 and the surfaces 38, 40 circularly disposed and having a maximum diameter normally sligtly larger than that of the hole 21. An optional pin 42 centrally secured in the body 20 serves to anchor an axially extending, resilient ground strap 44 or tube shield connector which may be in effective electrical connection with one or more of the contacts 30, the strap 44 being bent to provide latching shoulders 46, 48 corresponding axially to the shoulders 34, 36. As is common in socket construction for rotational registering purposes the holes 22 are evenly separated except for a sector between consecutive holes which usually corresponds with the axial position of the ground strap. Radially extending ridges 50 integral with the bottom end face 24 act in conventional manner as electrical barriers between adjacent contacts.

In order that the contacts 30 may make effective electrical connection only with appropriate conductors 52 (Fig. 2) of the circuit printed on a nonconducting socket support in the form of a wiring board 54, the periphery of the body 20 is provided with three shield-supporting lands 56 (here shown as dovetails) which uniformly project radially therefrom between the end faces 24, 26, the lands 56 corresponding in section and relative position with three registering slots 58 formed in the wiring board 54. For insuring that alinement of the contacts 30 with their appropriate conductor 52 is maintained though the socket body 20 is inverted or applied from either side of the wiring board, it will be noted that one of said lands 56 is angularly spaced from each of the other two lands 56 by the same number of degrees, but the three shield-supporting lands 56 are not angularly spaced equally from each other.

Figures 3, 4, 5:
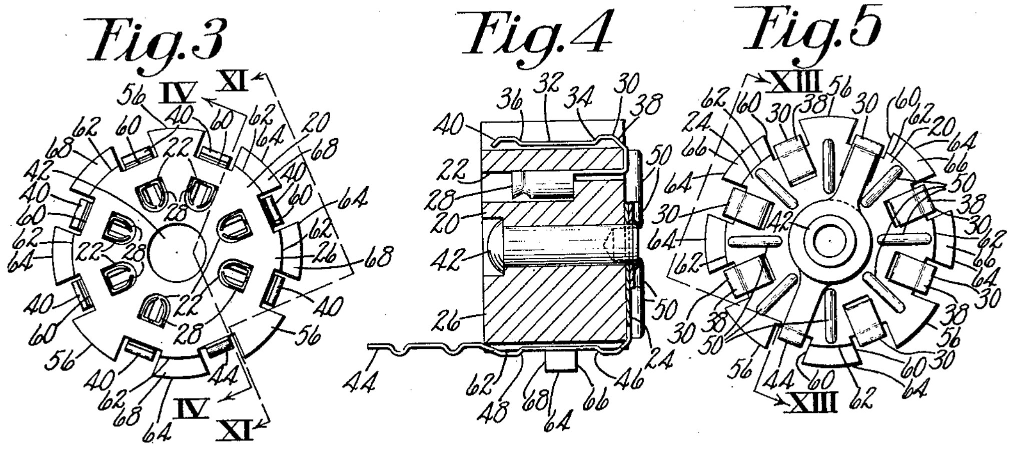
Fig. 3 is a plan view of the socket shown in Fig. 1.
Fig. 4 is a section taken on the line IV—IV of Fig. 3.
Fig. 5 is a bottom view of the socket shown in Fig. 1.

The periphery of the body 20 is further provided with other axially extending lands (shown as dovetails) and grooves 60, the latter receiving the tab portions 32, respectively, except for one groove 60 which receives a portion of the tube shield connector or ground strap 44. These other axially extending lands have portions 62, 62 adjacent to the end faces 24, 26 and projecting radially less than intermediate portions 64. Considered in a direction normal to the end faces 24, 26 the portions 64 are peripherally positioned substantially midway between the latching shoulders 34, 36 as indicated in Fig. 4. The portions 64 thus provide oppositely disposed stop surfaces 66, 68 respectively, which are spaced from the latching shoulders, when considered in said normal direction, by substantially the thickness of the wiring board. It will thus be seen (Fig. 11) that upon insertion, top end face 26 up, in the socket hole 21 of a wiring board 54 from one side thereof, the stop surfaces 66 engage that side, and the latching shoulders 34 of the contacts 30, by means of their resilience, cooperate in the manner of snap fasteners with the walls of the hole 21 and the other (copper) side of the board detachably to hold the socket mounted in fixed position. If, on the other hand, specifications require installation of this socket in the hole 21 from said other side of the wiring board 54, the socket still being top end face 26 up, the stop surfaces 68 engage that other side and the latching shoulders 36 will resiliently cooperate with the walls of the hole 21 and the first-mentioned, i. e., said one, side of the board detachably to hold the socket mounted in fixed position as indicated in Fig. 12. In like manner, the said socket may be inverted and inserted from above (as shown in Fig. 13) or below (not shown) with its bottom end face 24 up, the latching shoulders 34, 36 cooperating with the stop surfaces 66, 68, to position the socket heightwise of the wiring board. It will accordingly be seen that the same socket is enabled to receive the base pins of a tube or other component to hold it in operative position for protrusion from either side of the wiring board while the contact tabs 32, by reason of the correct registry being maintained by the lands 56 and the slots 58, are in effective and appropriate electrical connection with the conductors 52.

It will be appreciated that a ground strap is not in every instance necessary to the construction above described nor to the alternate structure next to be explained, and that some sockets may include two spaced tube shield connectors. An important consequence of the application of this invention is that one socket can be used to mount a tube or the like on either side of the board, and hence it now becomes possible for one machine to be employed in lieu of two to effect both types of tube mounting. Without affecting the configuration of the sockets herein shown it is possible, if desired, to shorten the tab portions 32 so that they respectively include only one latching shoulder and one bent or inclined surface.

It is to be noted that the structure of a modified socket generally designated 80, illustrated in Figs. 6, 8, 9, 10, 14 and 15, permits its insertion into a wiring board 84 (Fig. 7) having printed conductors 86 and from either side of the board, design of the printed circuit being modified, if necessary, to insure appropriate electrical connections. As herein shown, the socket 80 has a generally cylindrical body 88 susceptible of being less bulky than the body 20 and formed of non-conducting material, preferably a molded plastic, that may be inserted in a hole 82 (Fig. 7) with either its bottom end face 90 or its top end face 92 in up position, but usually only from above the component side of the board. The body 88 is provided with a plurality of holes 94 (frequently seven or nine) extending between its bottom end face 90 and its top end face 92, these holes corresponding with the above-mentioned holes 22 and being adapted respectively to receive inner pin engaging ends 96 (Figs. 8 and 9) of metallic contacts 98. Each of the latter has a resilient flat tab portion 100 that is bent in U-shaped fashion to extend radially beneath the bottom end face 90 and axially along the periphery of the body 88. For readily enabling the tab portions 100 yieldably to engage the walls of the hole 82 when inserted either end first, they are each formed with inclined surfaces 102, 104 and are each shaped to provide latching shoulders 106, 108 that are spaced apart by substantially the thickness of the wiring board 84. These shoulders 106, 108 accordingly define an interrupted circular board receiving groove which is preferably located midway between the end faces 90, 92.

In a manner similar to the previously described socket construction, a pin 110 is centrally secured in the body 88 to anchor an axially extending tube shield connector or ground strap 112 in effective electrical connection with one or more of the contacts 98, the strap 112 having latching shoulders 114, 116 positioned to constitute a portion of the interrupted board receiving groove just mentioned. The strap 112 corresponds in angular location with a space between a pair of consecutive holes 94 that is larger than the space which evenly separates the other holes 94. Radial ridges 118 on the bottom end face 90 are electrical barriers between adjacent contacts 98.

The periphery of the body 88 is formed with spaced axially extending grooves 120 for receiving the tab portions 100, respectively (one of the grooves 120 receiving a portion of the ground strap 112). Also, the periphery comprises a pair of diametrically opposite, axial lands 122 which uniformly project radially from the body to register it in one of two angular relations with the wiring board 84, and other axial lands 124, 126 of which there are three of each that are alternately arranged. End faces of the lands 122, 124 and 126 may support tube shields. The lands 124 project radially to a greater extent adjacent to the bottom end face 90 than adjacent to the top end face 92, whereas the lands 126 project radially to a greater extent adjacent to the top end face 92 than adjacent to the bottom end face 90. Accordingly, the lands 124 are formed with flat stop surfaces 128 lying substantially in a plane and engageable, when the socket is inserted bottom end up (Fig. 15), with that side of the wiring board from which the socket 80 is inserted, and the lands 126 are similarly formed with flat stop surfaces 130 lying substantially in another plane spaced from the plane just referred to by about the thickness of the wiring board. It may be said that the stop surfaces 130 are adapted to be engageable with that side of the wiring board 84 from which the socket 80 is inserted in top end up position. Thus, as may be seen in Fig. 15, when the socket 80 is inserted in the hole 82, bottom end face 90 being in up position and presented from the component side, the stop surfaces 130 pass through wiring board slots 132 (Fig. 7) to permit the stop surfaces 128 to engage the wiring board. When the socket 80 is inverted to be presented as shown in Fig. 14 and inserted in the hole 82, top end face 92 being in up position and presented from the component side, the stop surfaces 128 pass through the slots 132 to permit the stop surfaces 130 to engage the wiring board. In either case the lands 122 extend through oppositely disposed slots 134 in the wiring board to insure that the tab portions 100 will come into register for effective electrical connection with the appropriate conductors 86, the printed circuit having been designed for the purpose. In certain instances, of course, rather than change a particular circuit to accommodate an inverted socket, it may be preferable to provide a socket receiving hole 82 having its slots 132 oriented differently.

Having thus described our invention, what we claim as new and desire to secure by Letters Patent of the United States is:

1. A socket comprising a generally cylindrical nonconductive body having a plurality of circularly arranged pin-receiving holes extending from one end face to its other end face, said body having means formed thereon for predeterminedly registering it against turning movement about its axis and in relation to a support in which the socket is to be inserted, a plurality of U-shaped contacts having their respective pin receiving ends mounted in said holes and their other ends extending axially along the perimeter of the body, said other ends being each bent to provide a pair of resilient latching shoulders spaced apart by substantially the thickness of said support, and an axial land extending peripherally on the body between the consecutive pairs of latching shoulders, said axial lands respectively having a stop surface lying substantially in one of two planes parallel to and spaced from said end faces, alternate ones of said stop surfaces being substantially in the same plane and cooperative with the corresponding latching shoulders of each pair to hold the socket in predetermined heightwise relation in said support.

2. A socket as set forth in claim 1 and further characterized in that said alternate stop surfaces are disposed to cooperate with one side or the other of said support, depending on whether the socket is inserted in bottom up or top up position, to position the top and the bottom of the socket substantially the same extent from a surface of the support.

3. A socket for mounting in an encircling opening in a work support and for receiving the base pins of a tube or other component, comprising a generally cylindrical nonconductive body having a plurality of concentric pin-receiving holes extending from one end face to its other end face, said body having peripherally spaced axial lands and contact-receiving grooves extending between said end faces, and a plurality of U-shaped contacts having their respective pin-receiving end portions mounted in said holes and their other end portions extending axially in said grooves, said other end portions being respectively bent to provide pairs of spaced latching shoulders, and some of said axial lands having radially projecting intermediate portions providing oppositely disposed stop surfaces respectively spaced from the adjacent latching shoulders of said contacts, when considered in a direction normal to said end faces, by substantially the thickness of the work support to hold the socket in predetermined heightwise relation in the support.

4. The combination with a work support having a circular socket-receiving opening defined by walls formed with peripherally spaced slots and a cylindrical tube socket mounted in said opening having peripheral lands extending between its end faces and adapted to register with said slots when presented from either side of the support with either end face in up position, said socket having a plurality of peripheral grooves adapted to receive, respectively, the outer ends of pin-receiving contacts formed with axially spaced latching shoulders, the periphery of the socket being additionally formed with other lands spaced between said end faces and having stop surfaces parallel thereto for abutting either side of said support to fix the position of the socket therein in cooperation with said latching shoulders.

References Cited in the file of this patent

UNITED STATES PATENTS

| | | |
|---|---|---|
| 1,827,909 | Pumphrey | Oct. 20, 1931 |
| 2,711,522 | Goodwin | June 21, 1955 |

FOREIGN PATENTS

| | | |
|---|---|---|
| 711,016 | Great Britain | June 23, 1954 |